TWO-SPEED DRIVE

Filed Jan. 21, 1964 5 Sheets-Sheet 1

Inventors
John W. Karr
John Y. Ma
By Hofgren, Wegner, Allen, Stellman & McCord
Attorney.

Dec. 20, 1966 J. W. KARR ET AL 3,292,440

TWO-SPEED DRIVE

Filed Jan. 21, 1964 5 Sheets-Sheet 2

TWO-SPEED DRIVE

Dec. 20, 1966 J. W. KARR ET AL 3,292,440

TWO-SPEED DRIVE

Filed Jan. 21, 1964 5 Sheets-Sheet 5

United States Patent Office 3,292,440
Patented Dec. 20, 1966

3,292,440
TWO-SPEED DRIVE

John W. Karr, Mundelein, and John Y. Ma, Algonquin, Ill., assignors to Oak Electro/Netics Corp., a corporation of Delaware Filed Jan. 21, 1964, Ser. No. 339,133
12 Claims. (Cl. 74—10.5)

This invention relates to a two-speed manual control and more specifically to a tuning control for driving a continuous tuner in a television set.

The frequency spectrum allocated to the UHF television stations extends across many megacycles. Located within this band are several television stations broadcasting on predetermined frequencies. Television sets which are built to receive these signals have continuous tuners incorporated therein for tuning across the frequency spectrum. It is desirable to provide a tuning control which will rapidly span the frequency spectrum to a selected broadcast station and at the same time will permit fine tuning of the receiver to that station. To this end, the invention is directed.

Accordingly, it is an object of this invention to provide a two-speed manual tuning control.

It is a further object of this invention to provide a tuning control which preforms both the station selection function and the fine tuning function.

It is a feature of this invention to provide a two-speed manual drive control for a wave signal receiver including a continuous tuning device, comprising a driven member coupled to the device, a first drive means, including a first shaft having an aperture extending therethrough and having the shaft coupled to the driven member, for driving the tuning device, and a second drive means, including a second shaft extending through the aperture and including a power transmitting member coaxially aligned with and frictionally held to the driven member, for driving the tuning device.

It is a further feature of this invention to provide first and second gear trains operable from a pair of coaxially aligned shafts to actuate a driven member coupled to a continuous tuning device.

It is still a further feature of this invention to provide in a control device having two gear trains means for locking them together during predetermined portions of the operating range.

It is yet another feature of the invention to provide a housing for a two-speed tuning control which provides bearing surfaces for the gear trains to maintain them in proper operating position.

It is still a further feature of this invention to provide a power transmitting member frictionally held to a driven member by a spring encompassing a portion of said power transmitting member.

A further feature of the invention is to provide a yoke and cam arrangement whereby fine tuning is accomplished through rotation of the yoke about a tuner drive shaft.

It is still a further feature of the invention to provide a fine tuning arrangement for a television receiver having a pair of serially coupled frictional drive members.

Further features and advantages will become apparent from the following detailed description taken in connection with the accompanying drawings in which:

FIGURE 4 is a sectional view along line 4—4 of FIGURE 2;

Figures 1, 2:
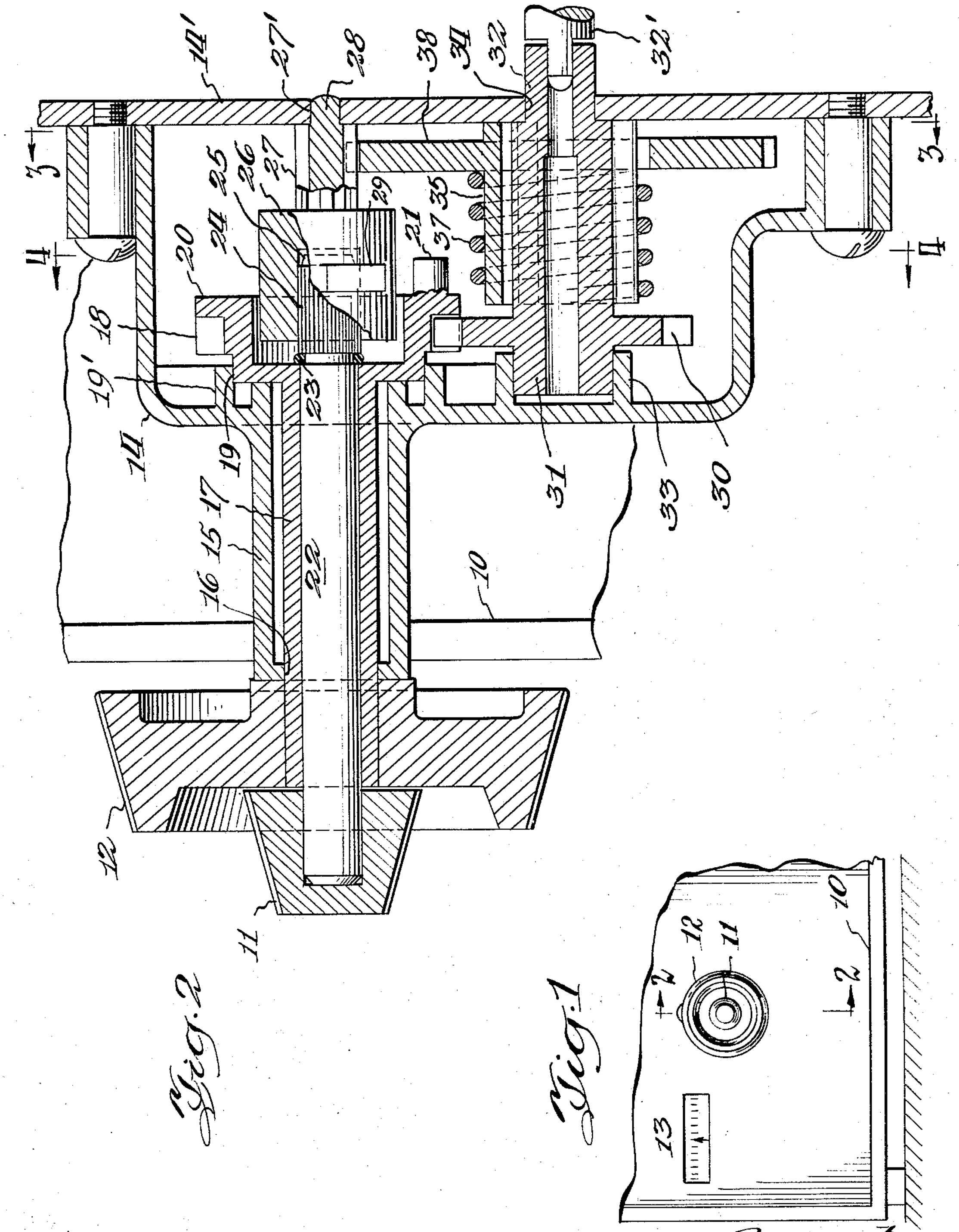
FIGURE 1 is a view of a portion of a television set incorporating a continuous tuning drive device.
FIGURE 2 is a cross-sectional view along line 2—2 in FIGURE 1, of the two-speed manual control, with certain parts broken away for clarity of illustration.
Figure 2:
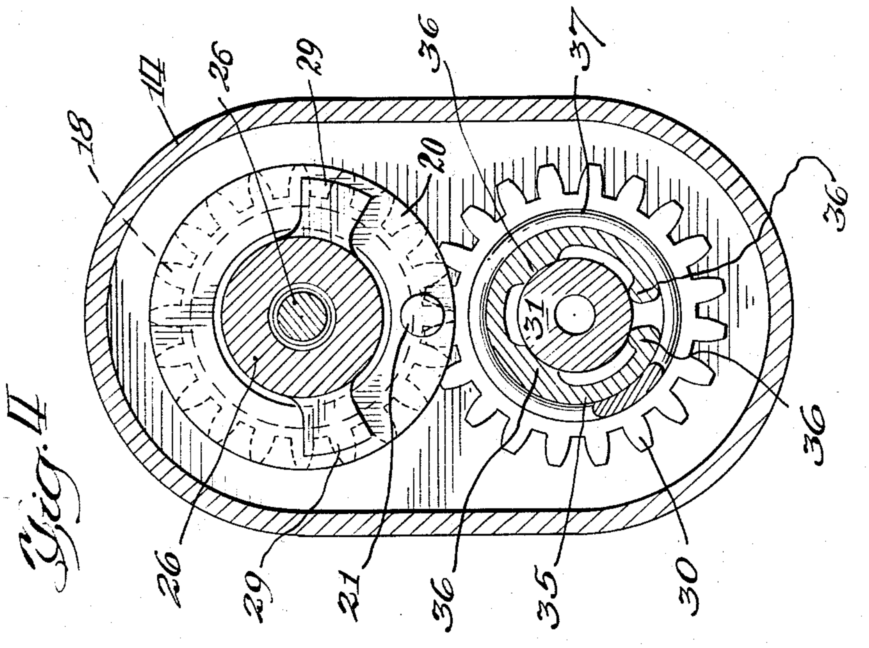
Figure 3:
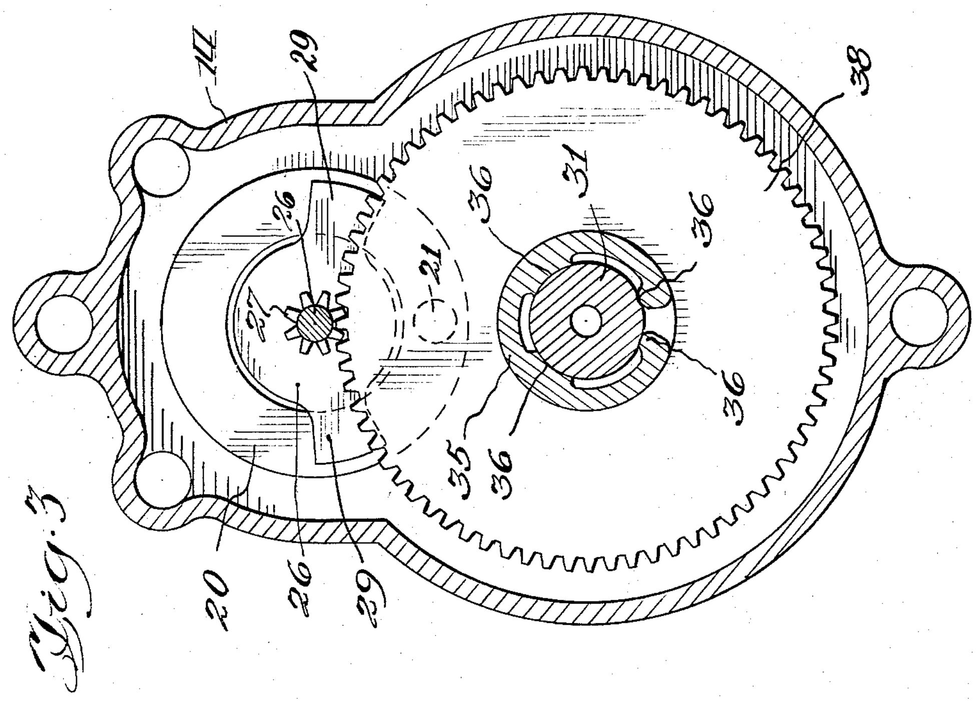
FIGURE 3 is a sectional view along line 3—3 of FIGURE 2.

While this invention is susceptible of embodiment in many different forms, there is shown in the drawings and will herein be described in detail two embodiments of the invention with the understanding that the present disclosure is to be considered as an exemplification of the principles of the invention and is not intended to limit the invention to the embodiments illustrated. The scope of the invention will be pointed out in the appended claims.

FIGURE 1 shows a television receiver utilizing the two-speed drive to provide for coarse tuning and fine tuning of the television receiver and further includes a station indicator 13 coupled through means (not shown) to a portion of the two-speed drive for providing a visual display of the station to which this set is tuned.

FIGURE 2, a cross-sectional view along line 2—2 of FIGURE 1, shows one form of a two-speed drive actuable by knob 11 to provide fine and coarse tuning. A casing 14 is provided having a plate 14' affixed thereto by a pair of screws and having an extension 15 with an aperture portion 16 at the end thereof. A driven shaft 17 is held for rotational motion within aperture 16 and has a gear 18 formed on one end thereof. Bearing surface 19 of gear 18 is disposed within a circular aperture member 19' formed on the inner face of casing 14 and supports gear 18 and shaft 17 for rotational movement. Gear 18 has a portion 20 on which is formed a pin 21 which extends substantially parallel to the axis of shaft 17.

A drive shaft 22 driven by knob 11 is rotatably held within shaft 17 and confined therein by a locking ring 23 and knob 11. A serrated portion 24 of shaft 22 engages a cylindrical opening 25 in a member 26 having a gear 27 formed on one end thereof. A reduced portion 27' of member 26 extends through an aperture 28 in wall 14' which, along with the serrated portion 24 of shaft 22, provides for rotational motion of gear 27. A pair of pin like projections 29, radially extending from member 26, are provided for engagement with pin 21 to supply positive direct driving torque from shaft 22 through pins 29, pin 21 and gear 18 to a driven gear 30 mounted on a hub 31 having a reduced portion 32 engaging a shaft 32' of a tuning device (not shown). Hub 31 is held for rotational motion by an annular extending portion 33 of casing 14 and aperture 34 in plate 14'.

In tuning from one station to another, the coarse adjustment is made as follows:

Knob 11 is rotated in either direction driving shaft 22 and member 26 until such time as one pin 29 engages pin 21 rotating gear 18 and driving the gear 30. Hub or shaft 31 is rotated thereby and the shaft 32' is rotated changing the tuning device from one station to another. In one successful drive the ratio of gears 18, 30 was 1:1.

In addition, there is provided a fine tuning adjustment. A hub 35, shown in detail in sectional views 3 and 4 along with the cross-sectional view in FIGURE 2, includes a plurality of inwardly extending members 36 having contact surfaces formed to engage hub 31. These members extend longitudinally along and parallel to the axis of hub 31, and are maintained in frictional engagement with hub 31 by a spring 37. A gear 38 is formed on hub 35 and has teeth engaging with the teeth on gear 27.

When knob 11 is rotated through a portion of a turn, during which a pin 29 does not positively engage pin 21, gear 27 rotates, driving gear 38, rotating hub 35 frictionally engaged with shaft 31, and tuner shaft 32 is rotated to provide fine tuning.

Indicator drive member 12 coupled to shaft 17 is rotated whenever gear 18 is driven. When coarse tuning is being accomplished a, pin 29 engages pin 21 and rotates the gear driving shaft 17. During the fine tuning portion of the operation of the two-speed device, gear 27 driven by shaft 22 rotates gear 38 frictionally coupled to shaft 31 and drives gear 30 engaged to gear 18 thus rotating the shaft 17 and turning the drive member 12.

The embodiment of the invention shown in FIGURES 5 through 9 is coupled to a tuning device shaft 50. A coupling connects a driven shaft 51 to shaft 50 through a crank arm 52, a pin 53 and a tuner shaft plate 54 having a slot 55 formed therein. Pin 53 and slot 55 permit variation in the alignments of the axes of the tuner shaft 50 and driven shaft 51. A certain amount of angular displacement between the axes of the shaft is also allowed for by this arrangement.

A housing 56 having an end plate 57 held thereto in rigid mechanical coupling by a pair of bolts 58 has formed therein a plurality of apertures 59, 60 and 61 and has a pair of annular bearing members 62, 63 formed projecting inwardly from the housing. A reduced portion 64 of shaft 51 is held within bearing member 63 and the enlarged main body portion of shaft 51 is journalled in aperture 60. The hub 65 of a double gear 66 and the hub 67 of a yoke member 68 are positioned on and confine shaft 51 within housing 56. This is accomplished by providing portion 69 of shaft 51 in a double-D configuration and providing raised portions 70, 71 thereon on the planar portion 69. Hub 65 has a pair of recess portions 72 and 73 provided to accommodate portions 70, 71. Thus, shaft 51 is prevented from longitudinal motion to the right by the housing 56 and to the left by hubs 65 and 67 plus raised portions 70, 71.

A knob (not shown) is held by a shank 75 and a set screw 76 to a shaft 77 whose axis extends substantially parallel to that of driven shaft 51. An indicator driven gear 78 is held within bearing member 62 and has a shaft 79 extending through an aperture 80 of housing 56 and has a station indicator 81 fastened thereto. Rotation of indicator driven gear 78 rotates the indicator 81 to show what station the tuner is receiving. Gear 78 has a cylindrical aperture 82 formed therein which provides a bearing surface for shaft 77.

A cam 83 has a portion 84 designed to fit within aperture 59 and to be held therein for rotational movement. A plurality of longitudinally extending splines 85, shown more clearly in FIGURE 9, are formed on cam 83 and are clamped by a spring clip 86 to provide a frictional coupling between shaft 77 and cam 83.

Figures 7, 8, 9:
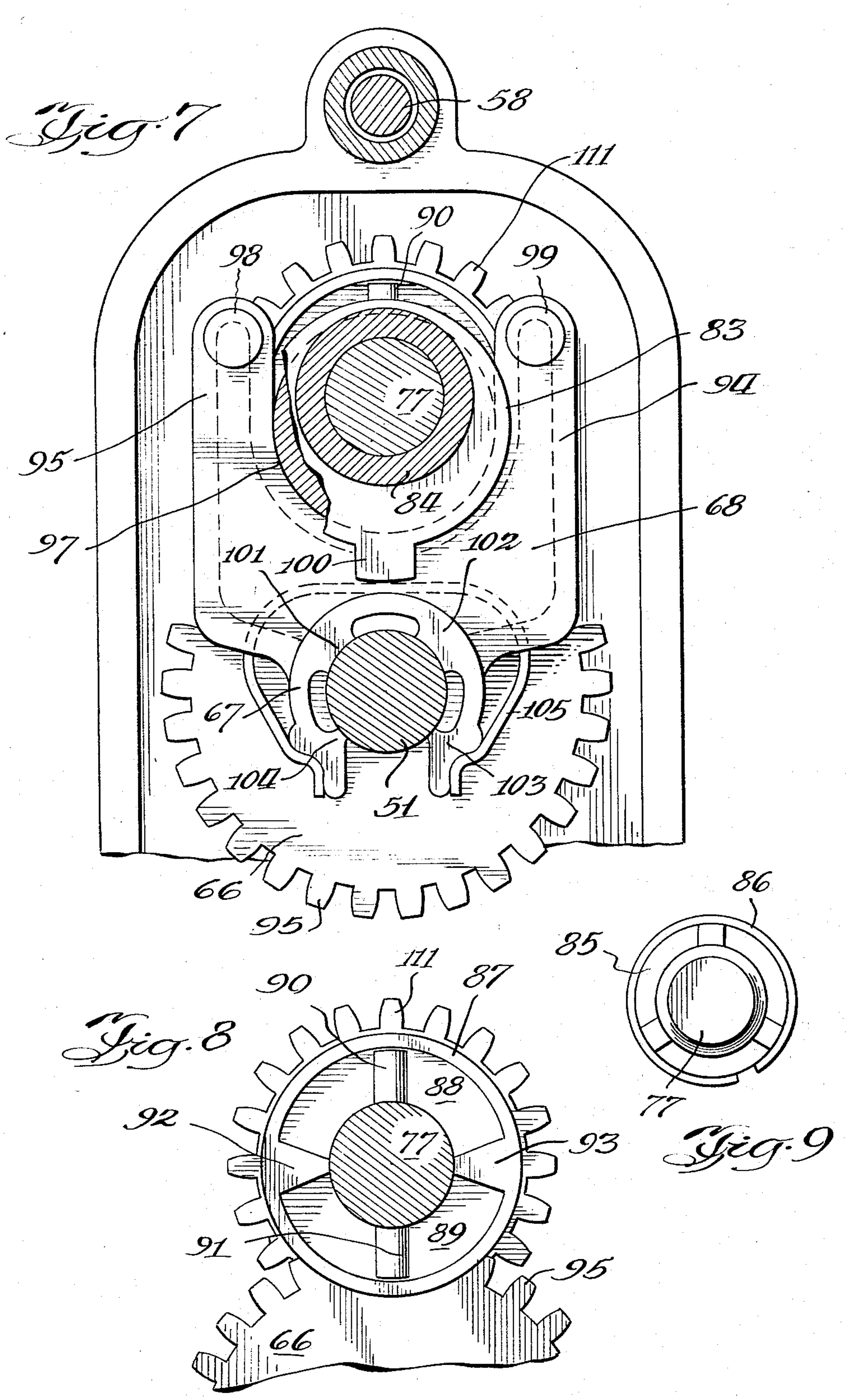
FIGURE 7 is a cross-sectional view along line 7—7 in FIGURE 5.
FIGURE 8 is a cross-sectional view along line 8—8 in FIGURE 5.
FIGURE 9 is a view along line 9—9 in FIGURE 5.

An idler gear 87 positioned between gear 78 and cam 83 has a pair of recessed portions 88 and 89 as shown in FIGURE 8, which confine a pair of pins 90, 91 which extend radially from shaft 77. The pins prevent the shaft from longitudinal motion to the right and knob base 75 prevents such motion to the left, thus confining the shaft within housing 56 in proper alignment therewith.

A pair of partitions 92, 93 separate the recessed portions 88, 89 and provide for positive coupling between shaft 77 and idler gear 87 when pins 90 and 91 are rotated sufficiently in either direction to come to engagement with the partitions. This occurs when the tuning knob coupled to the shaft 77 is rotated to select a station. Gear teeth 94 on idler gear 87 mate with teeth 95 on double gear 66 and provide for rotation of shaft 51. Although two pins and two partitions are shown within the idler gear 87, it is to be understood that elimination of one pin and one partition would allow for substantially one full turn of the tuning knob and shaft 77 before the idler gear would become positively engaged through the remaining pin and partition. Depending upon the design problems and receiver requirements, the proper rotation of shaft 77 before positively engaging idler 87 may be determined.

Fine tuning is accomplished through the cooperation ot shaft 77, cam 83, yoke 68, and shaft 51 in the following manner.

Figures 5, 6:
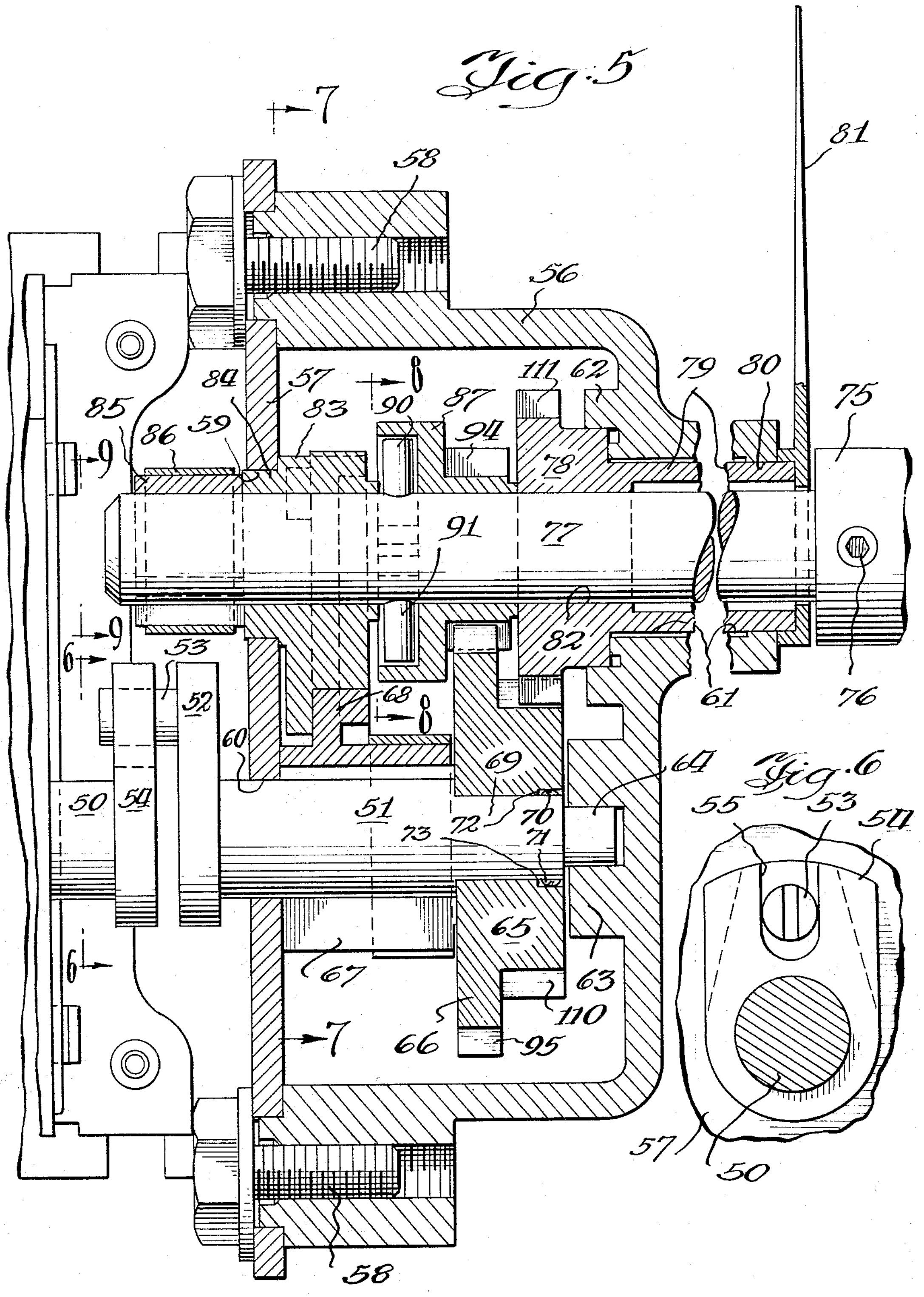
FIGURE 5 is a cross-sectional view of a second embodiment of the invention.
FIGURE 6 is a cross-sectional view along line 6—6 in FIGURE 5.

FIGURE 7 which is a view along line 7—7 in FIGURE 5 shows yoke member 68 including a pair of upstanding arms 94, 95 fastened to hub 67. An eccentric surface 97 is provided on cam 83 and engages the upstanding arms 94, 95 to rotate the yoke member about an axis centered on shaft 51 to either the right or the left, depending upon rotation of shaft 77. A pair of pins 98, 99 provide a limit for rotation of camming member 83 by engaging a tab 100 when the cam has been rotated a predetermined amount.

Hub 67 is quite similar in many respects to the hub shown in FIGURES 2 and 4; in this instance, a plurality of inwardly extending portions 101, 102, 103, and 104 have surfaces mating with shaft 51 and are held in frictional engagement therewith by a spring clip 105.

The viewer of a television set incorporating the embodiment shown in FIGURES 5–9 of the two-speed drive tunes to the station he desires to watch by turning shaft 77, engaging pins 90, 91 with partitions 92, 93 and positively coupling idler gear 87 through gear 66 to shaft 51. He then tunes slightly beyond the station. At that time, tab 100 is at rest against one of the pins 98, 99. The direction of rotation of shaft 77 is then reversed and cam 83 is rotated with tab 100 moving away from the pin. Eccentric surface 97 causes the yoke to rock about or rotate about the center of shaft 51 and the frictional coupling between members 101, 102, 103, 104, and shaft 51 cause shaft 51 to rotate thus rotating the tuner and providing the fine tuning adjustment.

A group of teeth 110 on gear 66 engage a group of teeth 111 on indicator driven gear 78, and when gear 66 is rotated, torque is applied to shaft 79, rotating it and causing indicator 81 to register the station to which the tuner is set.

The embodiment of the invention shown in FIGURES 10 through 13 is adapted to be coupled to a tuning device shaft 115. The linkage which connects a driven shaft 116 to tuning device 115 is the same as the coupling shown in FIGURES 5 and 6.

Figures 10, 11, 12, 13:
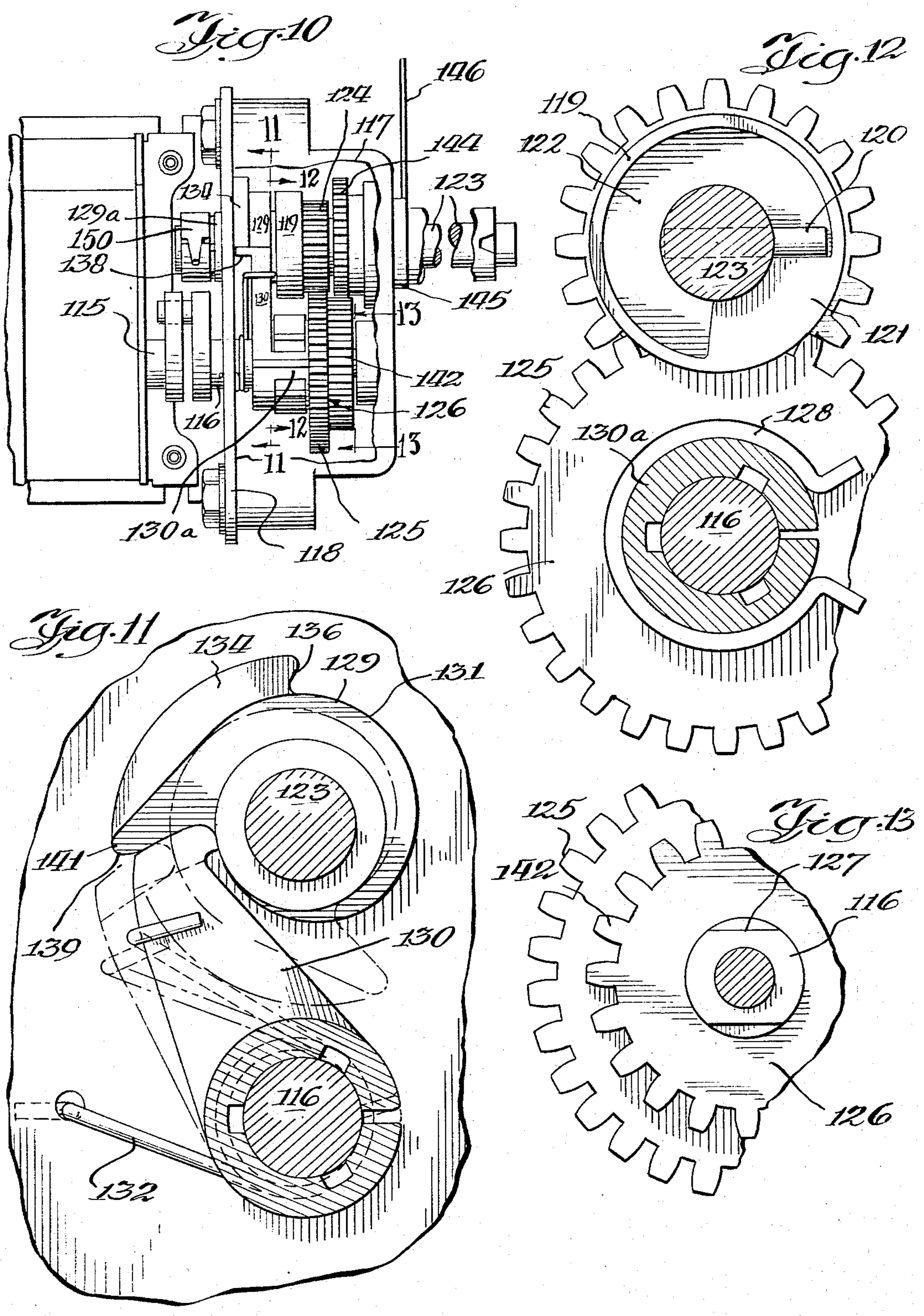
FIGURE 10 is a side elevational view of a third embodiment of the invention with a portion of the housing broken away to expose the drive system components.
FIGURE 11 is an enlarged cross-sectional view taken along line 11—11 in FIGURE 10.
FIGURE 12 is an enlarged cross-sectional view taken along line 12—12 in FIGURE 10.
FIGURE 13 is an enlarged cross-sectional view taken along line 13—13 in FIGURE 10.

Housing 117 and end plate 118 shown in FIGURE 10 are the same as those shown in FIGURE 5 and have apertures and bearing members corresponding to apertures 59, 60 and 61 and bearing members 60 and 63.

The fast tuning drive structure of the embodiment shown in FIGURES 10–13 is basically the same as that shown in FIGURES 5–9. However, instead of the two pins 90 and 91 protruding from shaft 77 and the two partitions 92 and 93 in idler gear 87, in this embodiment, shaft 123, which corresponds to shaft 77 in FIGURES 5–9, has only one pin 120. Idler gear 119, which corresponds to idler gear 87 in FIGURES 5–9, has only one partition 121 in recess 122 allowing for substantially three-quarters of a turn of the tuning knob (not shown) and shaft 123 before the idler gear 119 is positively engaged. This occurs when shaft 123 is rotated to select a station. Gear teeth 124 on idler gear 119 mate with teeth 125 on double gear 126 and provide for rotation of shaft 116. As seen in FIGURE 13, double gear 126 is mounted on a flattened portion 127 of shaft 116.

Depending upon the receiver requirements, the angle of rotation of shaft 123 for positively engaging idler gear 119 may be determined.

The fine tuning in the embodiment shown in FIGURES 10–13 is accomplished through the cooperation of shaft 123, cam 129, follower 130, and shaft 116 in the following manner.

Follower 130 is formed with an integral hub **130*a* which is held in frictional engagement with shaft 116 by spring clip 128. An involute surface 131 is provided on rotatable cam 129 and engages the follower 130 to rotate the follower about an axis centered on shaft 116 either to the right or left depending upon the direction of rotation of shaft 123. The cam 129 has an integral hub 129*a* which is frictionally mounted on shaft 123 and held for rotation therewith during the fine adjustment by clasp 150. The follower 130 is normally urged into engagement with involute surface 131 by wire spring 132 mounted on wall 118**.

The relatively slow rotation imparted to follower 130 is transmitted to driven shaft 116 through the hub **130*a* which is frictionally mounted on shaft 116**.

Cam 129 has a narrowed protrusion 134 providing a shoulder 136 adapted to engage dog 138 on follower 130 to stop the rotation of cam 129 so that follower 130 will not slide off the tail 141 of the cam during the coarse adjustment or station selection.

A viewer of a television set incorporating the embodiment of the two speed drive shown in FIGURES 10–13 tunes the station he desires to watch by turning shaft 123, engaging pin 120 with partition 121 and positively coupling idler gear 119 through gear 126 to driven shaft 116. He then tunes slightly beyond a station. At that time follower 130 is abutting shoulder 139 of cam 129 or dog 138 of follower 130 is engaging shoulder 136 depending on which direction shaft 123 has been turned. The direction of rotation of shaft 123 is then reversed and cam 129 is rotated therewith. The movement of cam 129 causes the follower 130 to rotate slowly in the direction of rotation of shaft 123 as it follows the involute surface 131 of cam 129. As follower 130 follows the involute surface 131 the frictional coupling between the hub **130*a* of follower 130 and shaft 116 causes shaft 116 to rotate thus rotating the tuner shaft 115** and providing the fine or slow tuning adjustment.

The drive for station indicator 146 includes a second group of teeth 142 on double gear 126 which engage drive gear 144 which is coupled to hollow shaft 145. When gear 126 is rotated during the fast tuning operation, torque is applied to hollow shaft 145, rotating it and causing indicator 146 to register the station to which the turner is set.

We claim:

1. A two-speed drive, comprising: a driven member having a first gear thereon; a first drive means, including a hollow shaft having a second gear thereon, said second gear meshing with said first gear, for driving said driven member at a first speed; a second drive means, including a second shaft coaxially aligned with and in said hollow shaft, a third gear having a hub frictionally held to said driven member, and a fourth gear driven by said second shaft and meshing with said third gear, for driving said driven member at a second speed.

2. A two-speed drive, comprising: a driven member; a first drive means, including a hollow shaft for driving said driven member at a first speed; a second drive means, including a second shaft coaxially aligned with and in said hollow shaft, a third gear having a hub, and a spring holding said hub in frictional engagement with said driven member, for rotating said driven member at a second speed.

3. A two-speed drive, comprising: a driven member having a first gear thereon; a first drive means for driving said driven member at a first speed, including a hollow shaft confined for rotary motion, a second gear on said hollow shaft meshing with said first gear, and a pin on said second gear having an axis substantially parallel to said hollow shaft; a second drive means, including a second shaft confined for rotation by said hollow shaft, a third gear frictionally held to said driven member, a fourth gear meshing with said third gear and driven by said second shaft, and a lug extending radially from said fourth gear to engage said pin, for driving said driven member at a second speed and for positively engaging said first drive means to rotate said driven member at said first speed.

4. The device of claim 3 wherein said housing has means formed therein including first and second annular portions and first and second apertures respectively coaxially aligned with said first and second annular portions for supporting said shafts and said driven member for rotational motion.

5. A two-speed drive, comprising: a frame; a driven member mounted for rotation in said frame and having a first gear thereon; a drive member mounted for rotation in said frame and having a second gear thereon engaging said first gear for rotating said driven member at a first speed; and drive means including a cam mounted for rotation with said drive member and an arm frictionally mounted on said driven member and engaging said cam for rotating said driven member at a second speed.

6. A two-speed drive, comprising: a frame; a driven member mounted for rotation in said frame and having a first gear thereon; a drive member spaced from said driven member and mounted for rotation on said frame, said drive member having a first drive means thereon including a second gear meshing with said first gear for rotating said driven member at a first speed; and second drive means including a cam mounted for rotation with said drive member and having an eccentric surface, and a yoke member frictionally mounted on said driven member for rotating said driven member, the eccentric surface of said cam engaging said yoke for rotating said driven member at a second speed.

7. A two-speed drive, comprising: a frame, a driven member mounted for rotation in said frame and having a first gear thereon; a drive member mounted for rotation in said frame and having a second gear carried thereon, said drive member being rotatable through an arc of less than 360° with respect to said second gear; means on said drive member for imparting rotation to said second gear, said second gear meshing with said first gear for rotating said driven member at a first speed; and drive means including a cam frictionally mounted on said drive member for rotation therewith and a follower frictionally mounted on the driven member, said cam engaging said follower for rotating said driven member at a second speed when said drive member rotates with respect to said second gear.

8. A two-speed drive, comprising: a housing; a driven member mounted for rotation in said housing, said driven member having a first gear mounted thereon; a drive member spaced from said driven member and mounted for rotation in said housing; an idler gear carried on said drive member and having a recess therein, said drive member having a transversely extending portion adapted to move within said recess and to engage the idler gear for imparting rotation to the idler gear, said idler gear meshing with said first gear for driving said driven member at a first speed; and drive means including a cam frictionally mounted on said drive member for rotation therewith, said cam having an involute surface, a follower frictionally mounted on the driven member for rotating said driven member and means urging said follower against the involute surface of said cam for rotating said driven member at a second speed while the transversely extending portion of said drive member moves within the recess in said idler gear.

9. A two-speed drive as set forth in claim 8 in which said drive member is spaced from and generally parallel with said driven member, and wherein said cam and said follower have elongated hubs embracing said drive member and driven member respectively, with a compressive means around each hub to frictionally bind the cam and follower to the drive member and driven member, respectively.

10. A two-speed drive as set forth in claim 8 wherein cooperating means are provided on said cam and said follower for limiting the rotation of said cam in either direction.

11. A two-speed drive as set forth in claim 10 wherein said follower includes an outwardly extending dog adjacent the end thereof, and said cam includes a first abutment engageable with the end of said follower to limit the rotation of the cam in one direction and a second abutment engageable with the follower dog to limit the rotation of the cam in the opposite direction.

12. A two-speed drive as set forth in claim 8 including indicators means rotatably mounted on said drive member, and means on said driven member for rotating said indicating means upon rotation of said driven member.

References Cited by the Examiner

UNITED STATES PATENTS

| | | | |
|---|---|---|---|
| 2,203,736 | 6/1940 | Mahnken | 74—10.5 |
| 2,761,321 | 9/1956 | Bieze | 74—10.5 |
| 2,839,936 | 6/1958 | Dawson | 74—10.5 |
| 3,167,272 | 1/1965 | Frode | 74—368 |

FOREIGN PATENTS

| | | |
|---|---|---|
| 644,048 | 10/1928 | France. |

DAVID J. WILLIAMOWSKY, *Primary Examiner.*

H. S. LAYTON, *Assistant Examiner.*